United States Patent
Tomura et al.

(10) Patent No.: US 11,270,889 B2
(45) Date of Patent: Mar. 8, 2022

(54) ETCHING METHOD AND ETCHING APPARATUS

(71) Applicant: Tokyo Electron Limited, Tokyo (JP)

(72) Inventors: Maju Tomura, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/646,245

(22) PCT Filed: May 31, 2019

(86) PCT No.: PCT/JP2019/021860
§ 371 (c)(1),
(2) Date: Mar. 11, 2020

(87) PCT Pub. No.: WO2019/235398
PCT Pub. Date: Dec. 12, 2019

(65) Prior Publication Data
US 2021/0082709 A1    Mar. 18, 2021

(30) Foreign Application Priority Data

| Jun. 4, 2018 | (JP) | JP2018-107142 |
| Jan. 18, 2019 | (JP) | JP2019-006472 |
| May 30, 2019 | (JP) | JP2019-101416 |

(51) Int. Cl.
*H01L 21/3065* (2006.01)
*H01L 21/683* (2006.01)
*H01L 21/3213* (2006.01)

(52) U.S. Cl.
CPC ...... *H01L 21/3065* (2013.01); *H01L 21/6831* (2013.01); *H01L 21/32137* (2013.01)

(58) Field of Classification Search
CPC ............. H01L 21/3065; H01L 21/6831; H01L 21/31116; H01L 21/31138; H01L 21/3085;
(Continued)

(56) References Cited

U.S. PATENT DOCUMENTS

| 6,905,800 B1* | 6/2005 | Yuen | G03F 7/427 |
| | | | 134/1.2 |
| 8,664,125 B2* | 3/2014 | Raley | H01J 37/32192 |
| | | | 438/740 |

(Continued)

FOREIGN PATENT DOCUMENTS

| JP | H01-112731 A | 5/1989 |
| JP | H06-181190 A | 6/1994 |

(Continued)

OTHER PUBLICATIONS

International Search Report for PCT/JP2019/021860 dated Jul. 30, 2019.

*Primary Examiner* — Lan Vinh
(74) *Attorney, Agent, or Firm* — Peame & Gordon LLP

(57) ABSTRACT

An etching method includes preparing a compound; and etching an etching target in an environment in which the compound is present. The etching of the etching target includes: etching the etching target in an environment in which hydrogen (H) and fluorine (F) are present when the etching target contains silicon nitride (SiN); and etching the etching target in an environment in which nitrogen (N), hydrogen (H) and fluorine (F) are present when the etching target contains silicon (Si). The compound contains an element that forms an anion of an acid stronger than hydrogen fluoride (HF) or contains an element that forms a cation of a base stronger than ammonia ($NH_3$).

18 Claims, 11 Drawing Sheets

(58) Field of Classification Search
CPC .............. H01L 21/31105; H01L 21/314; H01L 21/32137; H01L 21/0217; H01L 21/02164; H01L 21/022; H01L 21/67069; H01J 37/32082
USPC ....... 438/700, 706, 710, 712, 714, 719, 723, 438/736; 216/67; 156/345.29, 345.52, 156/345.27
See application file for complete search history.

(56) References Cited

U.S. PATENT DOCUMENTS

| | | | |
|---|---|---|---|
| 2002/0121502 A1* | 9/2002 | Patel | B81C 1/00476 |
| | | | 216/73 |
| 2015/0270140 A1* | 9/2015 | Gupta | H01L 21/32136 |
| | | | 216/67 |
| 2016/0126064 A1* | 5/2016 | Yamawaku | H01J 37/3211 |
| | | | 216/67 |
| 2016/0260619 A1* | 9/2016 | Zhang | H01L 21/32136 |

FOREIGN PATENT DOCUMENTS

| | | |
|---|---|---|
| JP | H11-087324 A | 3/1999 |
| JP | 2013-128109 A | 6/2013 |
| JP | 2014-179576 A | 9/2014 |
| JP | 2015-079876 A | 4/2015 |
| JP | 2016-197680 A | 11/2016 |
| JP | 2016-197713 A | 11/2016 |
| JP | 2016-207840 A | 12/2016 |

* cited by examiner

ETCHING METHOD AND ETCHING APPARATUS

CROSS-REFERENCE TO RELATED APPLICATION

This Application is a U.S. national phase application under 35 U.S.C. § 371 of PCT Application No. PCT/JP2019/021860 filed on May 31, 2019, which claims the benefit of Japanese Patent Application Nos. 2018-107142, 2019-006472 and 2019-101416 filed on Jun. 4, 2018, Jan. 18, 2019 and May 30, 2019, respectively, the entire disclosures of which are incorporated herein by reference.

TECHNICAL FIELD

The various aspects and embodiments described herein pertain generally to an etching method and an etching apparatus.

BACKGROUND

There is known a method of etching holes of a high aspect ratio in a semiconductor wafer in which a silicon oxide film and a silicon nitride film are stacked under a low temperature environment (see Patent Document 1).

PRIOR ART DOCUMENT

Patent Document 1: Japanese Patent Laid-open Publication No. 2016-207840
Patent Document 2: Japanese Patent Laid-open Publication No. 2015-079876

Means for Solving the Problems

An etching method includes preparing a compound; and etching an etching target in an environment in which the compound is present. The etching of the etching target includes: etching the etching target in an environment in which hydrogen (H) and fluorine (F) are present when the etching target contains silicon nitride (SiN); and etching the etching target in an environment in which nitrogen (N), hydrogen (H) and fluorine (F) are present when the etching target contains silicon (Si). The compound contains an element that forms an anion of an acid stronger than hydrogen fluoride (HF) or contains an element that forms a cation of a base stronger than ammonia ($NH_3$).

DETAILED DESCRIPTION

Hereinafter, exemplary embodiment of an etching method and an etching apparatus according to the present disclosure will be described in detail based on the accompanying drawings.

[Overall Configuration of Etching Apparatus 10]

Figure 1:
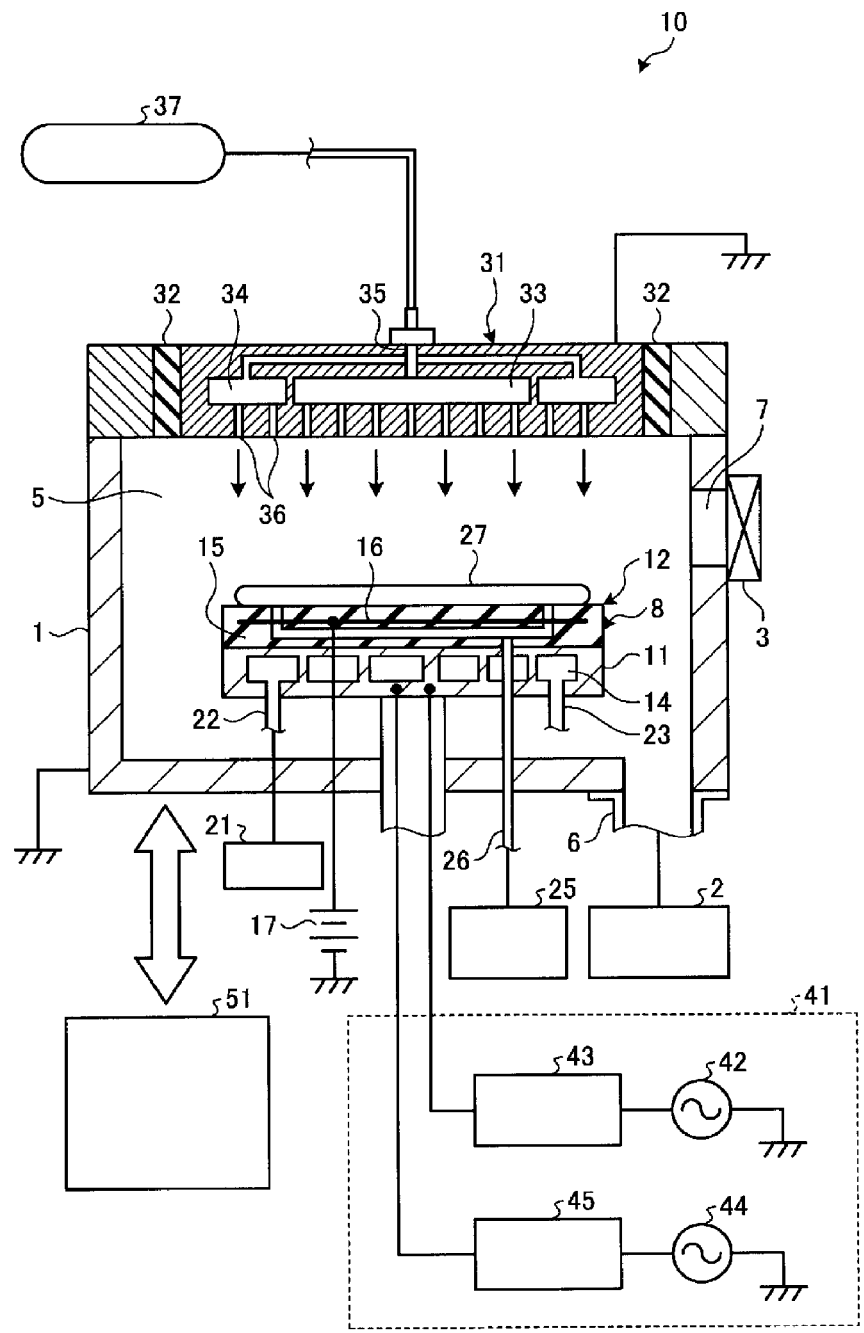
FIG. 1 is a longitudinal cross-sectional view illustrating an example of an etching apparatus 10.

FIG. 1 is a longitudinal cross-sectional view illustrating an example of an etching apparatus 10. The etching apparatus 10 is a capacitively-coupled plasma processing apparatus and includes a chamber 1, a gas exhaust device 2 and a gate valve 3. The chamber 1 is formed of aluminum and has a cylinder shape, and a surface of the chamber 1 is alumite-treated (anodically oxidized). The chamber 1 is electrically grounded. A processing space 5 is formed inside the chamber 1. The chamber 1 isolates the processing space 5 from an external atmosphere. The chamber 1 is further equipped with a gas exhaust port 6 and an opening 7. The gas exhaust port 6 is formed at a bottom surface of the chamber 1. The opening 7 is formed at a side wall of the chamber 1. The gas exhaust device 2 is connected to the processing space 5 of the chamber 1 via the gas exhaust port 6. The gas exhaust device 2 exhausts a gas from the processing space 5 via the gas exhaust port 6. The gate valve 3 opens the opening 7 or closes the opening 7.

The etching apparatus 10 further includes a placing table 8. The placing table 8 is placed in the processing space 5 and provided at a bottom portion of the chamber 1. The placing table 8 includes a supporting table 11 and an electrostatic chuck 12. The supporting table 11 is made of a conductor such as aluminum (Al), titanium (Ti) and silicon carbide (SiC). The supporting table 11 is supported by the chamber 1. A coolant path 14 is formed within the supporting table 11. The electrostatic chuck 12 is placed on an upper surface of the supporting table 11 and supported by the supporting table 11. The electrostatic chuck 12 includes an electrostatic chuck main body 15 and a chuck electrode 16. The electrostatic chuck main body 15 is formed of an insulating material. In the electrostatic chuck 12, the chuck electrode 16 is embedded within the electrostatic chuck main body 15. The etching apparatus 10 further includes a DC voltage source 17. The DC voltage source 17 is electrically connected to the chuck electrode 16 and supplies a DC current to the chuck electrode 16.

The etching apparatus 10 further includes a chiller 21, a coolant inlet line 22 and a coolant outlet line 23. The chiller 21 is connected to the coolant path 14 via the coolant inlet line 22 and the coolant outlet line 23. The chiller 21 is configured to cool a cooling medium such as cooling water or brine, and circulates the cooled cooling medium in the coolant path 14 through the coolant inlet line 22 and the coolant outlet line 23 so as to cool the electrostatic chuck 12 of the placing table 8.

The etching apparatus 10 further includes a heat transfer gas source 25 and a heat transfer gas supply line 26. One end of the heat transfer gas supply line 26 is connected to an upper surface of the electrostatic chuck 12. The heat transfer gas source 25 supplies a heat transfer gas, such as a helium gas (He) or an argon gas (Ar), to the heat transfer gas supply line 26 and introduces the heat transfer gas between a wafer 27 placed on the placing table 8 and the electrostatic chuck 12.

The etching apparatus 10 further includes a gas shower head 31 and a shield ring 32. The gas shower head 31 is made of a conductor and has a circular plate shape. The gas shower head 31 is placed so as to face the placing table 8 and also placed such that a plane of a lower surface of the gas shower head 31 is substantially parallel with a plane of an upper surface of the placing table 8. The gas shower head 31 is also placed so as to close an opening formed at a ceiling of the chamber 1. The shield ring 32 is made of an insulating material and has a ring shape. A peripheral portion of the gas shower head 31 is covered by the shield ring 32. The gas shower head 31 is supported by the chamber 1 via the shield ring 32 so that the gas shower head 31 and the chamber 1 are insulated from each other. The gas shower head 31 is electrically grounded. Further, the gas shower head 31 may be connected to a variable DC power supply and may be applied with a predetermined DC voltage.

A center-side diffusion space 33, an edge-side diffusion space 34, a gas inlet opening 35 and a plurality of gas supply holes 36 are formed within the gas shower head 31. The center-side diffusion space 33 is formed at a central portion within the gas shower head 31. The edge-side diffusion space 34 is formed at a peripheral portion within the gas shower head 31 to be disposed between an edge of the gas shower head 31 and the center-side diffusion space 33. The gas inlet opening 35 is formed above the center-side diffusion space 33 and the edge-side diffusion space 34 within the gas shower head 31 and communicates with each of the center-side diffusion space 33 and the edge-side diffusion space 34. The plurality of gas supply holes 36 is formed under the center-side diffusion space 33 and the edge-side diffusion space 34 within the gas shower head 31 and communicates with the center-side diffusion space 33 and the edge-side diffusion space 34 and also communicates with the processing space 5.

The etching apparatus 10 further includes a processing gas source 37. The processing gas source 37 is connected to the gas inlet opening 35. The processing gas source 37 supplies a predetermined processing gas to the gas inlet opening 35. The processing gas contains a gas mixture in which carbon tetrafluoride ($CF_4$) and hydrogen ($H_2$) are mixed. Also, a predetermined compound is added in the processing gas. Examples of the compound may include a chlorine gas ($Cl_2$), silicon tetrachloride ($SiCl_4$), hydrogen bromide (HBr) and hydrogen iodide (HI). Further, carbon tetrafluoride ($CF_4$) may be substituted with sulfur hexafluoride ($SF_6$) or sulfur tetrafluoride ($SF_4$).

The supporting table 11 of the placing table 8 is used as a lower electrode and the gas shower head 31 is used as an upper electrode. The etching apparatus 10 further includes a power supply device 41. The power supply device 41 includes a first high frequency power supply 42, a first matching device 43, a second high frequency power supply 44 and a second matching device 45. The first high frequency power supply 42 is connected to the placing table 8 via the first matching device 43. The first high frequency power supply 42 supplies first high frequency power of a first frequency (e.g., 40 MHz) to the supporting table 11 of the placing table 8 at a preset power level. The first matching device 43 matches a load impedance to an internal (or output) impedance of the first high frequency power supply 42. The first matching device 43 is configured to match the internal impedance of the first high frequency power supply 42 with the load impedance when plasma is formed in the processing space 5.

The second high frequency power supply 44 is connected to the placing table 8 via the second matching device 45. The second high frequency power supply 44 supplies a second high frequency power of a second frequency (e.g., 0.3 MHz) lower than the first frequency to the placing table 8 at a preset power level. The second matching device 45 matches a load impedance to an internal (or output) impedance of the second high frequency power supply 44. The second matching device 45 is configured to match the internal impedance of the second high frequency power supply 44 with the load impedance when the plasma is formed in the processing space 5. Also, in the present exemplary embodiment, the first high frequency power and the second high frequency power are applied to the placing table 8, but may be applied to the gas shower head 31.

Figure 2:
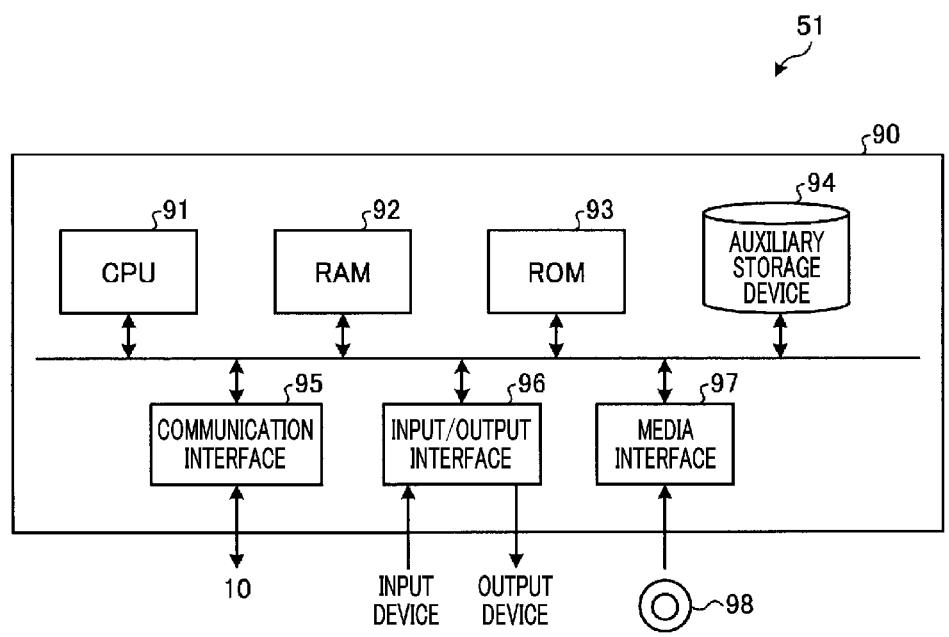
FIG. 2 is a diagram illustrating an example of a control device 51.

The etching apparatus 10 further includes a control device 51. FIG. 2 is a diagram illustrating an example of the control device 51. The control device 51 is implemented by a computer 90. The computer 90 includes a central processing unit (CPU) 91, a random access memory (RAM) 92 and read only memory (ROM) 93. The CPU 91 operates based on a program installed in the computer 90 and controls the respective components of the computer 90 to control the etching apparatus 10. The ROM 93 stores a boot program executed by the CPU 91 at the time of startup of the computer 90 or a program dependent on the hardware of the computer 90.

The computer 90 further includes an auxiliary storage device 94, a communication interface 95, an input/output interface 96 and a media interface 97. The auxiliary storage device 94 stores a program executed by the CPU 91 and data used by the program. The auxiliary storage device 94 may be, e.g., a hard disk drive (HDD) and a solid state drive (SSD). The CPU 91 reads out the program from the auxiliary storage device 94, loads the read-out program onto the RAM 92 and executes the loaded program.

The communication interface 95 communicates with the etching apparatus 10 via a communication line such as a local area network (LAN). The communication interface 95 outputs information received from the etching apparatus 10 to the CPU 91 via the communication line and transmits data generated by the CPU 91 to the etching apparatus 10 via the communication line.

The computer 90 further includes an input device such as a keyboard, and an output device such as a display. The CPU 91 controls the input device and the output device via the input/output interface 96. The input/output interface 96 transmits a signal inputted via the input device to the CPU 91 and outputs the data generated by the CPU 91 to the output device.

The media interface 97 reads out a program or data stored in a non-transitory tangible storage medium 98. Examples of the storage medium 98 may include an optical storage medium, a magneto-optical storage medium, a tape medium, a magnetic storage medium or a semiconductor memory. Examples of the optical storage medium may include a digital versatile disc (DVD) or a phase change rewritable disk (PD). Examples of the magneto-optical storage medium may include a magneto-optical disk (MO).

The CPU 91 executes the program read out from the storage medium 98 via the media interface 97. Alternatively, the CPU 91 may execute a program acquired from another device via the communication interface 95.

[Etching Method]

The etching method is performed by using the etching apparatus 10. First, in the etching method, the control device 51 controls the gate valve 3 to open the opening 7. When the opening 7 is opened, the wafer 27 as a target object is carried into the processing space 5 of the chamber 1 through the opening 7 to be placed on the placing table 8. After the wafer 27 is placed on the placing table 8, the control device 51 controls the DC voltage source 17 to apply the DC voltage to the chuck electrode 16. While the DC voltage is applied to the chuck electrode 16, the wafer 27 is held on the electrostatic chuck 12 by a Coulomb force. The control device 51 also controls the gate valve 3 to close the opening 7. When the opening 7 is closed, the control device 51 controls the gas exhaust device 2 to evacuate the atmosphere of the processing space 5 to a predetermined vacuum level.

While the wafer 27 is held on the electrostatic chuck 12, the control device 51 controls the heat transfer gas source 25 to supply the heat transfer gas to the heat transfer gas supply line 26 and supply the heat transfer gas between the electrostatic chuck 12 and the wafer 27. The control device 51 also controls the chiller 21 to circulate the coolant, which is cooled to a predetermined temperature, in the coolant path 14 and thus cools the electrostatic chuck 12. In this case, heat of the electrostatic chuck 12 is transferred to the wafer 27 via the heat transfer gas supplied between the electrostatic chuck 12 and the wafer 27, and, thus, the temperature of the wafer 27 is controlled to be included in a predetermined temperature range.

When the wafer 27 is controlled to a predetermined temperature, the control device 51 controls the processing gas source 37 to supply a processing gas having a predetermined composition to the gas inlet opening 35. After being supplied to the gas inlet opening 35, the processing gas is supplied to the center-side diffusion space 33 and the edge-side diffusion space 34 to be diffused in the center-side diffusion space 33 and the edge-side diffusion space 34. After being diffused in the center-side diffusion space 33 and the edge-side diffusion space 34, the processing gas is supplied in a shower shape into the processing space 5 of the chamber 1 through the plurality of gas supply holes 36 to be filled in the processing space 5.

The control device 51 controls the first high frequency power supply 42 and the second high frequency power supply 44 to supply the first high frequency power for plasma formation and the second high frequency power for bias to the placing table 8. As the first high frequency power is supplied to the placing table 8, plasma is formed and radicals or ions, light and electrons are generated in the processing space 5. The ions in the plasma are accelerated toward the wafer 27 as the second high frequency power is supplied to the placing table 8. The wafer 27 is etched by the radicals or the ions contained in the plasma formed in the processing space 5.

After the wafer 27 is etched, the control device 51 controls the first high frequency power supply 42 and the second high frequency power supply 44 to stop the supply of the high frequency powers to the processing space 5. Also, the control device 51 controls the DC voltage source 17 to apply a DC voltage whose polarity is opposite to that of the voltage applied at the time of attracting the wafer 27 to the chuck electrode 16. Since the DC voltage having the opposite polarity is applied to the chuck electrode 16, the wafer 27 is charge-neutralized and separated from the electrostatic chuck 12. The control device 51 also controls the gate valve 3 to open the opening 7. If the wafer 27 is not held on the electrostatic chuck 12, the wafer 27 is carried out from the processing space 5 of the chamber 1 through the opening 7 when the opening 7 is opened.

It is known that an etching target containing silicon nitride (SiN) is plasma-etched by using a fluorocarbon-based gas and a modification layer is formed on the surface of the etching target. It is known that the modification layer is decomposed or sublimated by heating the etching target at about 200° C.

In the above-described etching method, the wafer 27 is etched in an atmosphere in which hydrogen (H) and fluorine (F) are present. In the above-described etching method, it is assumed that when the wafer 27 contains silicon dioxide ($SiO_2$), a chemical reaction represented by the following chemical formula are made.

$$Si(OH)_4 + HF \rightarrow SiF(OH)_3 + H_2O \quad -0.40 \text{ eV}$$

$$SiF(OH)_3 + HF \rightarrow SiF_2(OH)_2 + H_2O \quad -0.78 \text{ eV}$$

$$SiF_2(OH)_2 + HF \rightarrow SiF_3(OH) + H_2O \quad -1.11 \text{ eV}$$

$$SiF_3(OH) + HF \rightarrow SiF_4 + H_2O \quad -1.38 \text{ eV}$$

According to the above-described chemical reaction, when the wafer 27 is etched in the atmosphere in which hydrogen (H) and fluorine (F) are present, silicon tetrafluoride ($SiF_4$) is produced. Silicon tetrafluoride ($SiF_4$) is highly volatile. For this reason, when the wafer 27 is formed of silicon dioxide ($SiO_2$) only and when the wafer 27 is etched by hydrogen fluoride (HF), silicon tetrafluoride ($SiF_4$) can hardly adhere to the surface of the wafer 27.

In the above-described etching method, it is assumed that when the wafer 27 contains silicon nitride (SiN), a chemical reaction represented by the following chemical formula progresses.

$$Si(NH_2)_4 + HF \rightarrow SiF(NH_2)_3 + NH_3 - 1.08 \text{ eV}$$

$$SiF(NH_2)_3 + HF \rightarrow SiF_2(NH_2)_2 + NH_3 - 2.03 \text{ eV}$$

$$SiF_2(NH_2)_2 + HF \rightarrow SiF_3(NH_2) + NH_3 - 2.77 \text{ eV}$$

$$SiF_3(NH_2) + HF \rightarrow SiF_4 + NH_3 - 3.04 \text{ eV}$$

$$SiF_4 + HF + NH_3 \rightarrow (NH_4)SiF_5 - 3.90 \text{ eV}$$

$$(NH_4)SiF_5 + HF + NH_3 \rightarrow (NH_4)_2SiF_6 - 4.80 \text{ eV}$$

Even in these chemical reactions, silicon tetrafluoride ($SiF_4$) is produced as silicon dioxide ($SiO_2$) is etched in an atmosphere in which hydrogen (H) and fluorine (F) are present. According to the above-described chemical reactions, when the wafer 27 is etched in an atmosphere in which hydrogen (H) and fluorine (F) are present, ammonia ($NH_3$) is also produced. Also, according to the above-described chemical reaction, it is assumed that ammonium fluorosilicate (($NH_4)_2SiF_6$) (hereinafter, described as "salt (AFS)") derived from silicon tetrafluoride ($SiF_4$) and ammonia ($NH_3$) is produced.

Figure 3:
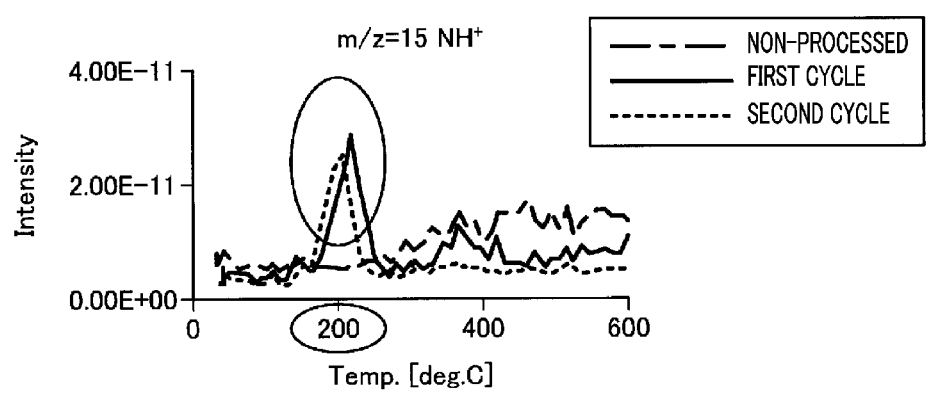
FIG. 3 is a graph showing a TDS analysis result of a by-product adhering to a surface of a wafer etched by an etching method of a comparative example 1 with respect to a gas having a mass number (m/z) of 15.

FIG. 3 is a graph showing an analysis result of a by-product adhering to the surface of the wafer 27 etched by an etching method of a comparative example 1 by Thermal Desorption Spectroscopy (TDS) with respect to a gas having a mass number (m/z) of 15. In the etching method of the comparative example 1, the wafer 27 contains silicon nitride (SiN) and is etched under the following process conditions. Further, the TDS analysis is performed three times in total to a single non-processed wafer and two processed wafers.

Pressure within processing space 5: 80 mTorr
Frequency of first high frequency power: 100 MHz
Power of first high frequency power: 2500 W (effective)
Frequency of second high frequency power: 400 kHz
Power of second high frequency power: 1000 W
Composition of processing gas: $SF_6/H_2$
Temperature of wafer: −60° C.

The graph in FIG. 3 shows that when the wafer 27 etched by the etching method of the comparative example 1 is heated to about 200° C., a gas having a mass number (m/z) of 15 is generated from the surface of the wafer 27. It is assumed that the gas having the mass number (m/z) of 15 is $NH^+$. For this reason, the graph in FIG. 3 shows that the by-product adhering to the surface of the wafer 27 by the etching method of the comparative example 1 is assumed as a compound containing $NH^+$.

Figure 4:
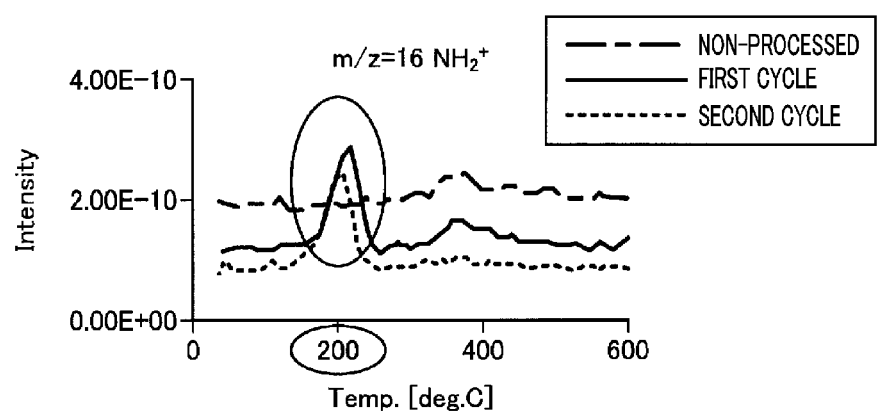
FIG. 4 is a graph showing a TDS analysis result of a by-product adhering to the surface of the wafer etched by the etching method of the comparative example 1 with respect to a gas having a mass number (m/z) of 16.

FIG. 4 is a graph showing an analysis result of a by-product adhering to the surface of the wafer 27 etched by the etching method of the comparative example 1 by TDS with respect to a gas having a mass number (m/z) of 16. The graph in FIG. 4 shows that when the wafer 27 etched by the etching method of the comparative example 1 is heated to about 200° C., a gas having a mass number (m/z) of 16 is generated from the surface of the wafer 27. It is assumed that the gas having a mass number (m/z) of 16 is $NH_2^+$. For this reason, the graph in FIG. 4 shows that the by-product adhering to the surface of the wafer 27 by the etching method of the comparative example 1 is assumed as a compound containing $NH_2^+$.

Figure 5:
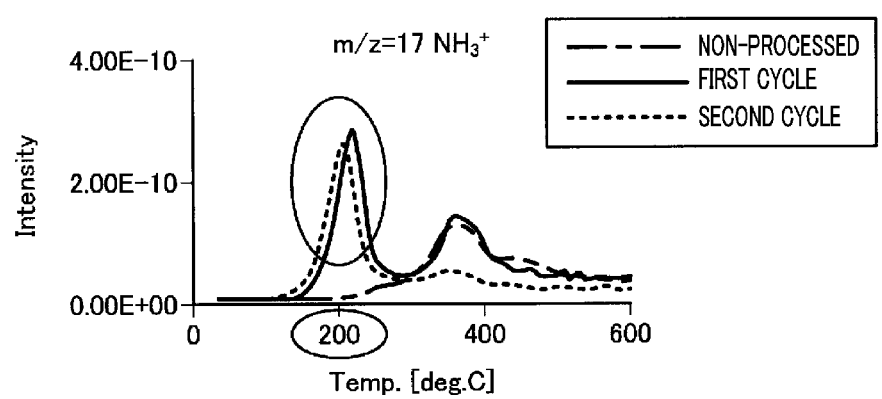
FIG. 5 is a graph showing a TDS analysis result of a by-product adhering to the surface of the wafer etched by the etching method of the comparative example 1 with respect to a gas having a mass number (m/z) of 17.

FIG. 5 is a graph showing an analysis result of a by-product adhering to the surface of the wafer 27 etched by the etching method of the comparative example 1 by TDS with respect to a gas having a mass number (m/z) of 17. The graph in FIG. 5 shows that when the wafer 27 etched by the etching method of the comparative example 1 is heated to about 200° C., a gas having a mass number (m/z) of 17 is generated from the surface of the wafer 27. It is assumed that the gas having the mass number (m/z) of 17 is $NH_3^+$. For this reason, the graph in FIG. 5 shows that the by-product adhering to the surface of the wafer 27 by the etching method of the comparative example 1 is assumed as a compound containing $NH_3^+$. Further, a peak around 400° C. is also observed from the non-processed wafer and thus can be assumed as derived from the substrate.

Figure 6:
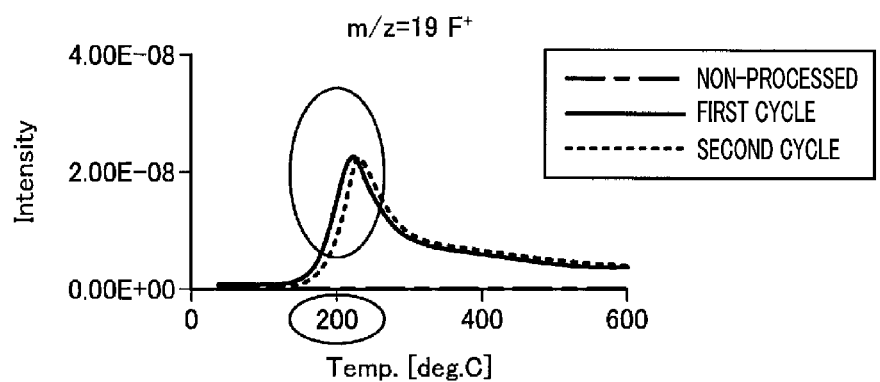
FIG. 6 is a graph showing a TDS analysis result of a by-product adhering to the surface of the wafer etched by the etching method of the comparative example 1 with respect to a gas having a mass number (m/z) of 19.

FIG. 6 is a graph showing an analysis result of a by-product adhering to the surface of the wafer 27 etched by the etching method of the comparative example 1 by TDS with respect to a gas having a mass number (m/z) of 19. The graph in FIG. 6 shows that when the wafer 27 etched by the etching method of the comparative example 1 is heated to about 200° C., a gas having a mass number (m/z) of 19 is generated from the surface of the wafer 27. It is assumed that the gas having the mass number (m/z) of 19 is F. For this reason, the graph in FIG. 6 shows that the by-product adhering to the surface of the wafer 27 by the etching method of the comparative example 1 is assumed as a compound containing $F^+$.

Figure 7:
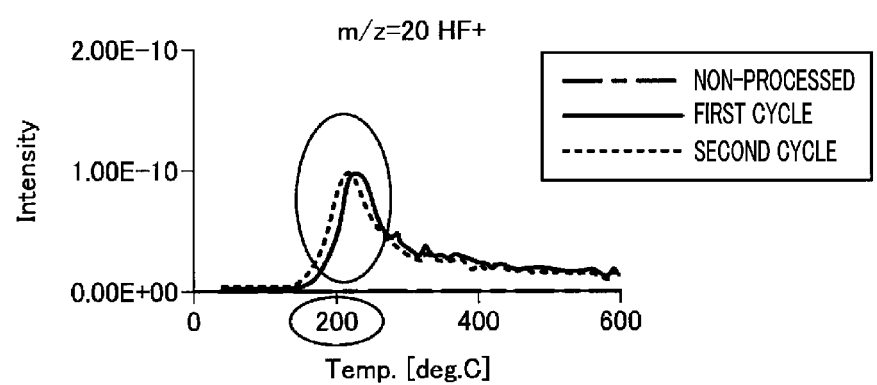
FIG. 7 is a graph showing a TDS analysis result of a by-product adhering to the surface of the wafer etched by the etching method of the comparative example 1 with respect to a gas having a mass number (m/z) of 20.

FIG. 7 is a graph showing an analysis result of a by-product adhering to the surface of the wafer 27 etched by the etching method of the comparative example 1 by TDS with respect to a gas having a mass number (m/z) of 20. The graph in FIG. 7 shows that when the wafer 27 etched by the etching method of the comparative example 1 is heated to about 200° C., a gas having a mass number (m/z) of 20 is generated from the surface of the wafer 27. It is assumed that the gas having the mass number (m/z) of 20 is $HF^+$. For this reason, the graph in FIG. 7 shows that the by-product adhering to the surface of the wafer 27 by the etching method of the comparative example 1 is assumed as a compound containing $HF^+$.

Figure 8:
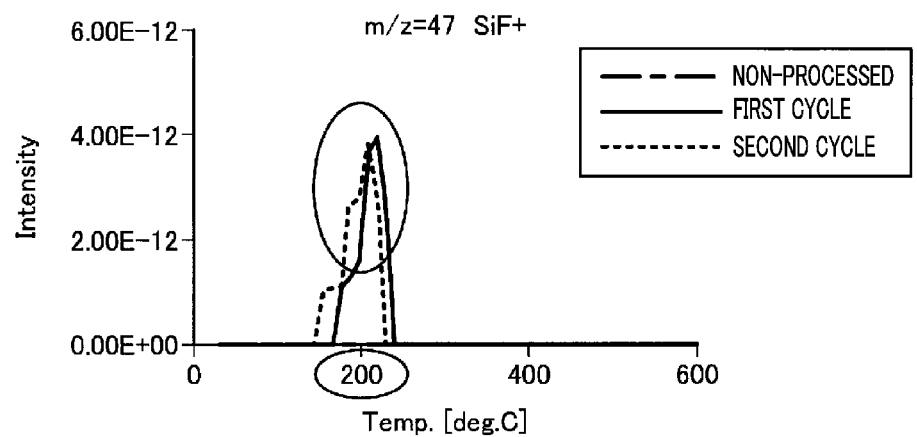
FIG. 8 is a graph showing a TDS analysis result of a by-product adhering to the surface of the wafer etched by the etching method of the comparative example 1 with respect to a gas having a mass number (m/z) of 47.

FIG. 8 is a graph showing an analysis result of a by-product adhering to the surface of the wafer 27 etched by the etching method of the comparative example 1 by TDS with respect to a gas having a mass number (m/z) of 47. The graph in FIG. 8 shows that when the wafer 27 etched by the etching method of the comparative example 1 is heated to about 200° C., a gas having a mass number (m/z) of 47 is generated from the surface of the wafer 27. It is assumed that the gas having the mass number (m/z) of 47 is $SiF^+$. For this reason, the graph in FIG. 8 shows that the by-product adhering to the surface of the wafer 27 by the etching method of the comparative example 1 is assumed as a compound containing $SiF^+$.

Figure 9:
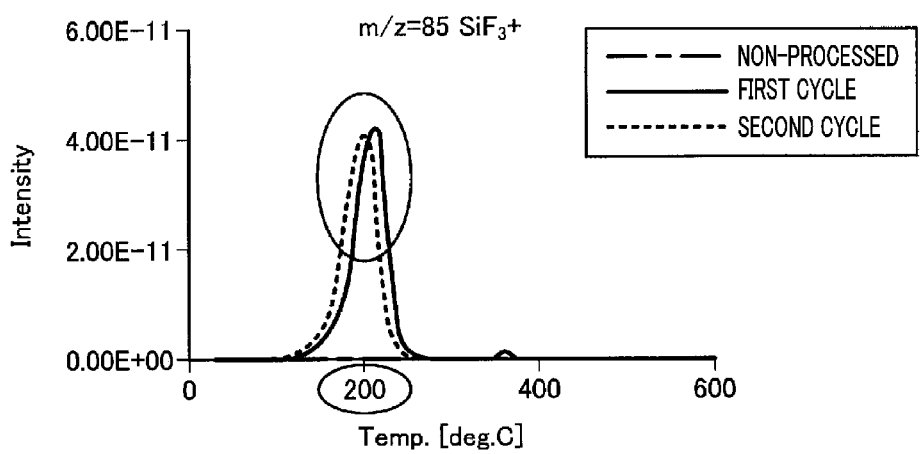
FIG. 9 is a graph showing a TDS analysis result of a by-product adhering to the surface of the wafer etched by the etching method of the comparative example 1 with respect to a gas having a mass number (m/z) of 85.

FIG. 9 is a graph showing an analysis result of a by-product adhering to the surface of the wafer 27 etched by the etching method of the comparative example 1 by TDS with respect to a gas having a mass number (m/z) of 85. The graph in FIG. 9 shows that when the wafer 27 etched by the etching method of the comparative example 1 is heated to about 200° C., a gas having a mass number (m/z) of 85 is generated from the surface of the wafer 27. It is assumed that the gas having the mass number (m/z) of 85 is $SiF_3^+$. For this reason, the graph in FIG. 9 shows that the by-product adhering to the surface of the wafer 27 by the etching method of the comparative example 1 is assumed as a compound containing $SiF_3^+$.

FIG. 3 to FIG. 9 show that the by-products adhering to the surface of the wafer 27 by the etching method of the comparative example 1 are assumed as the compounds containing $NH^+$, $NH_2^+$, $NH_3^+$, $F^+$, $HF^+$, $SiF^+$ and $SiF_3^+$, respectively. That is, FIG. 3 to FIG. 9 show that the by-products produced by the etching method of the comparative example 1 are salt (AFS).

Figure 10:
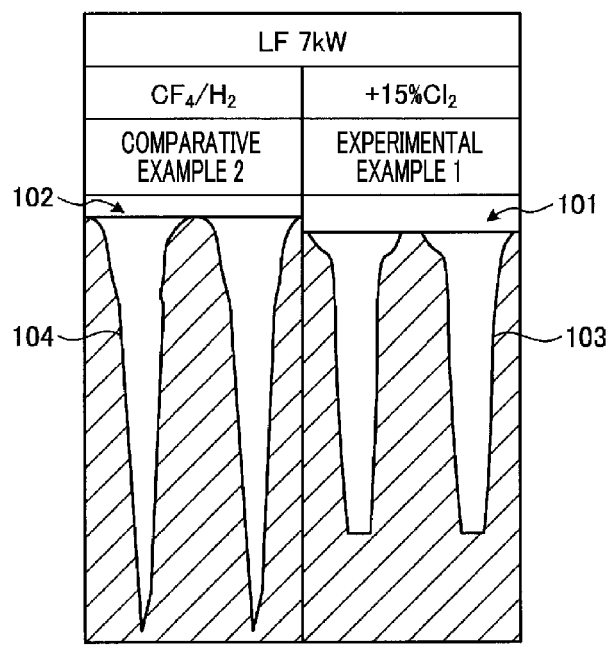
FIG. 10 illustrates a comparison result between a wafer etched by an etching method of an experimental example 1 and a wafer etched by an etching method of a comparative example 2.

FIG. 10 illustrates a comparison result between a wafer 101 etched by an etching method of an experimental example 1 and a wafer 102 etched by an etching method of a comparative example 2. The wafer 101 includes a silicon substrate, a silicon nitride film and a photoresist. The silicon nitride film is made of silicon nitride (SiN). The silicon nitride film is formed on a one-side surface of the silicon substrate. The photoresist is provided openings in a predetermined pattern. The photoresist is formed on the silicon nitride film so that the silicon nitride film can be interposed between the silicon substrate and the photoresist.

In the etching method of the experimental example 1, the wafer 101 is etched under the following process conditions. Also, a flow rate of chlorine gas ($Cl_2$) to be added is represented as a ratio with respect to a total flow rate of the processing gas.

Pressure within processing space 5: 25 mTorr
    Frequency of first high frequency power: 40 MHz
    Power of first high frequency power: 4.5 kW
    Frequency of second high frequency power: 0.4 MHz
    Power of second high frequency power: 7 kW
    Composition of processing gas: $CF_4/H_2/15\%\ Cl_2$
    Temperature of wafer: −60° C.

The wafer 102 is formed in the same manner as the wafer 101. In the etching method of the comparative example 2, the wafer 102 is etched under the following process conditions. That is, in the etching method of the comparative example 2, chlorine gas ($Cl_2$) is not added in the processing gas and the other conditions are the same as in the etching method of the experimental example 1.

Pressure within processing space 5: 25 mTorr
    Frequency of first high frequency power: 40 MHz
    Power of first high frequency power: 4.5 kW
    Frequency of second high frequency power: 0.4 MHz
    Power of second high frequency power: 7 kW
    Composition of processing gas: $CF_4/H_2$
    Temperature of wafer: −60° C.

FIG. 10 shows a cross section of the wafer 101 and a cross section of the wafer 102. The comparison result in FIG. 10 shows that the dimension of a bottom surface of an etching hole 103 formed in the wafer 101 is larger than the dimension of a bottom surface of an etching hole 104 formed in the wafer 102. If there is no change in dimension of an opening of an etching hole, a cross-sectional shape of the etching hole becomes close to a rectangular shape as the dimension of the bottom surface of the etching hole increases and the cross-sectional shape of the etching hole becomes close to a tapered shape as the dimension of the bottom surface of the etching hole decreases. That is, the comparison result in FIG. 10 shows that the etching method of the experimental example 1 can form an etching hole having a large-dimension bottom surface and more appropriately etch the wafer 101, as compared with the etching method of the comparative example 2. Accordingly, the comparison result in FIG. 10 shows that the etching method of the experimental example 1 reduces the amount of salt (AFS)-containing etching by-product adhering to the wafer, as compared with the etching method of the comparative example 2.

Figure 11:
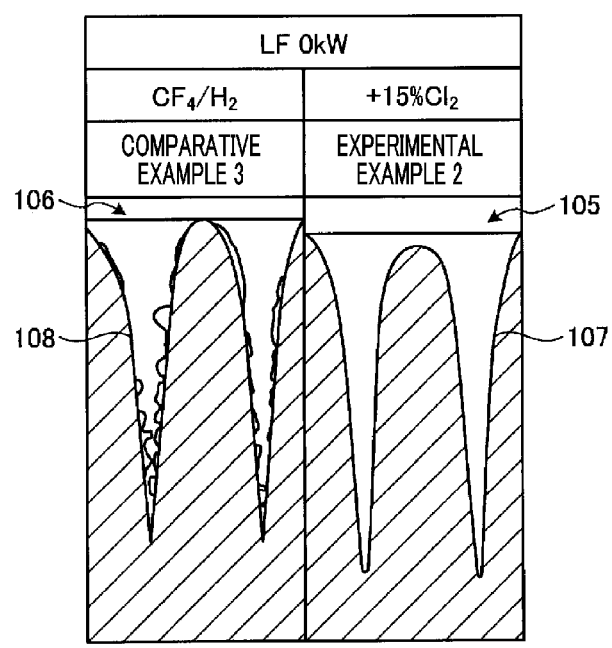
FIG. 11 illustrates a comparison result between a wafer etched by an etching method of an experimental example 2 and a wafer etched by an etching method of a comparative example 3.

FIG. 11 illustrates a comparison result between a wafer 105 etched by an etching method of an experimental example 2 and a wafer 106 etched by an etching method of a comparative example 3. The wafer 105 is formed in the same manner as the wafer 101. In the etching method of the experimental example 2, the wafer 105 is etched under the following process conditions.

Pressure within processing space 5: 25 mTorr
    Frequency of first high frequency power: 40 MHz
    Power of first high frequency power: 4.5 kW
    Frequency of second high frequency power: 0.4 MHz
    Power of second high frequency power: 0 kW
    Composition of processing gas: $CF_4/H_2/15\%\ Cl_2$
    Temperature of wafer: −60° C.

The wafer 106 is formed in the same manner as the wafer 101. In the etching method of the comparative example 3, the wafer 106 is etched under the following process conditions. That is, in the etching method of the comparative example 3, chlorine gas ($Cl_2$) is not added in the processing gas and the other conditions are the same as in the etching method of the experimental example 2.

Pressure within processing space 5: 25 mTorr
    Frequency of first high frequency power: 40 MHz
    Power of first high frequency power: 4.5 kW
    Frequency of second high frequency power: 0.4 MHz
    Power of second high frequency power: 0 kW
    Composition of processing gas: $CF_4/H_2$
    Temperature of wafer: −60° C.

FIG. 11 shows a cross section of the wafer 105 and a cross section of the wafer 106. The comparison result in FIG. 11 shows that an amount of a by-product adhering to an inner wall surface of an etching hole 107 formed in the wafer 105 is smaller than an amount of a by-product adhering to an inner wall surface of an etching hole 108 formed in the wafer 106. That is, the comparison result in FIG. 11 shows that the etching method of the experimental example 2 can reduce the amount of the by-product adhering to the inner wall surface of the etching hole, as compared with the etching method of the comparative example 3. Accordingly, the comparison result in FIG. 11 shows that the etching method of the experimental example 2 can suppress the degree of bending of the etching hole, as compared with the etching method of the comparative example 3.

Figure 12:
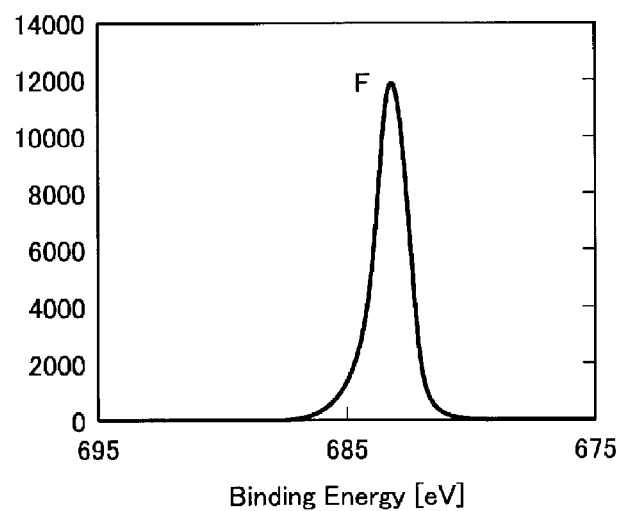
FIG. 12 is a graph showing an XPS analysis result of a surface of a wafer etched by an etching method of a comparative example 4 with respect to fluorine (F).

FIG. 12 is a graph showing an analysis result of X-ray Photoelectron Spectroscopy (XPS) of a surface of a wafer etched by an etching method of a comparative example 4 with respect to fluorine (F). The wafer contains silicon nitride (SiN). In the etching method of the comparative example 4, the wafer is etched under the following process conditions.

Pressure within processing space 5: 80 mTorr
    Frequency of first high frequency power: 40 MHz
    Power of first high frequency power: 2.5 kW
    Frequency of second high frequency power: 0.4 MHz
    Power of second high frequency power: 1 kW
    Composition of processing gas: $CF_4/H_2$
    Temperature of wafer: −70° C.

FIG. 12 shows that a predetermined amount of fluorine (F) is present on the surface of the wafer etched by the etching method of the comparative example 4 and a predetermined amount of a by-product containing fluorine (F) adheres to the surface of the wafer.

Figure 13:
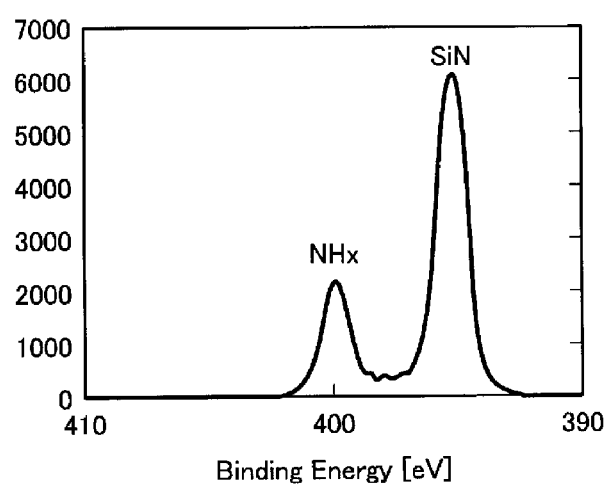
FIG. 13 is a graph showing an XPS analysis result of the surface of the wafer etched by the etching method of the comparative example 4 with respect to nitrogen (N).

FIG. 13 is a graph showing the XPS analysis result of the surface of the wafer etched by the etching method of the comparative example 4 with respect to nitrogen (N). FIG. 13 shows that a predetermined amount of nitrogen (N) is present on the surface of the wafer etched by the etching method of the comparative example 4 and a predetermined amount of a by-product containing nitrogen (N) adheres to the surface of the wafer.

Figure 14:
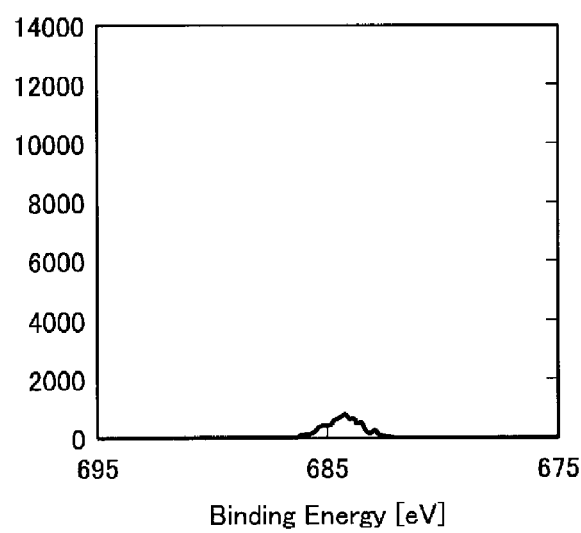
FIG. 14 is a graph showing an XPS analysis result of a surface of a wafer etched by an etching method of an experimental example 3 with respect to fluorine (F).

FIG. 14 is a graph showing the XPS analysis result of the surface of a wafer etched by an etching method of an experimental example 3 with respect to fluorine (F). The wafer is formed in the same manner as the wafer used in the etching method of the comparative example 4 and contains silicon nitride (SiN). In the etching method of the experimental example 3, the wafer is etched under the following process conditions.

Pressure within processing space 5: 80 mTorr
Frequency of first high frequency power: 40 MHz
Power of first high frequency power: 2.5 kW
Frequency of second high frequency power: 0.4 MHz
Power of second high frequency power: 1 kW
Composition of processing gas: $CF_4/H_2/5\% \ Cl_2$
Temperature of wafer: −70° C.

FIG. 14 shows that a predetermined amount of fluorine (F) is present on the surface of the wafer etched by the etching method of the experimental example 3 and a predetermined amount of a by-product containing fluorine (F) adheres to the surface of the wafer. FIG. 12 and FIG. 14 show that the amount of fluorine (F) in the by-product adhering to the surface of the wafer etched by the etching method of the experimental example 3 is smaller than the amount of fluorine (F) in the by-product adhering to the surface of the wafer etched by the etching method of the comparative example 4.

Figure 15:
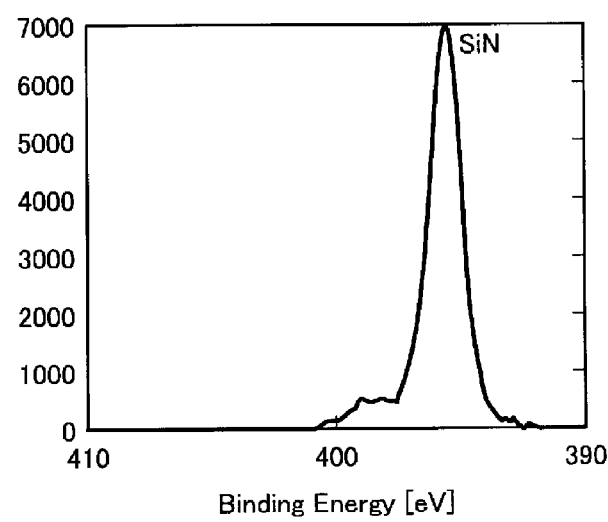
FIG. 15 is a graph showing an XPS analysis result of the surface of the wafer etched by the etching method of the experimental example 3 with respect to nitrogen (N).

FIG. 15 is a graph showing the XPS analysis result of the surface of the wafer etched by the etching method of the experimental example 3 with respect to nitrogen (N). FIG. 15 shows that a predetermined amount of nitrogen (N) is present on the surface of the wafer etched by the etching method of the experimental example 3 and a predetermined amount of a by-product containing nitrogen (N) adheres to the surface of the wafer. FIG. 13 and FIG. 15 show that the amount of nitrogen (N) in the by-product adhering to the surface of the wafer etched by the etching method of the experimental example 3 is smaller than the amount of nitrogen (N) in the by-product adhering to the surface of the wafer etched by the etching method of the comparative example 4. That is, FIG. 12, FIG. 13, FIG. 14 and FIG. 15 show that the etching method of the experimental example 3 can reduce the amount of the by-product adhering to the surface of the wafer, as compared with the etching method of the comparative example 4. Also, it is assumed that the peaks around 397 eV in FIG. 13 and FIG. 15 are derived from the compositions of the respective wafers used.

It is assumed that when chlorine gas ($Cl_2$) is supplied, the salt (AFS) undergoes a chemical reaction represented by the following chemical formula to be decomposed and sublimated.

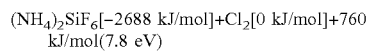
$(NH_4)_2SiF_6[-2688 \ kJ/mol]+Cl_2[0 \ kJ/mol]+760 \ kJ/mol(7.8 \ eV)$

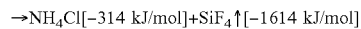
$\rightarrow NH_4Cl[-314 \ kJ/mol]+SiF_4\uparrow[-1614 \ kJ/mol]$

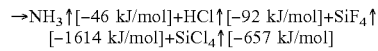
$\rightarrow NH_3\uparrow[-46 \ kJ/mol]+HCl\uparrow[-92 \ kJ/mol]+SiF_4\uparrow [-1614 \ kJ/mol]+SiCl_4\uparrow[-657 \ kJ/mol]$ That is, it is assumed that the above-described etching method of experimental examples can reduce the amount of the by-product adhering to the surface of the wafer by decomposing the salt (AFS) produced by the etching.

The etching method according to the exemplary embodiment includes preparing chlorine gas ($Cl_2$) and etching the wafer 27 in the atmosphere in which chlorine gas ($Cl_2$) is present. Even if the wafer 27 is etched at a temperature lower than a temperature (e.g., 200° C.) at which the salt (AFS) is decomposed or sublimated, this etching method can decompose the salt (AFS) adhering to the wafer 27 and thus reduce the amount of the salt (AFS) adhering to the wafer 27. According to this etching method, the amount of the salt (AFS) adhering to the wafer 27 can be reduced, and, thus, the wafer 27 can be etched appropriately.

A composite produced by decomposing the salt (AFS) needs to be volatilized and removed without being left. That is, the temperature of a wafer is desirably higher than a temperature at which a silicon-containing reaction product represented by halogenated silicon, such as $SiF_4$ or $SiCl_4$, that has a relatively low vapor pressure among the compounds produced by decomposing the salt (AFS) is volatilized. Desirably, the temperature of the wafer is high particularly on the surface of the wafer on which the chemical reaction occurs during the decomposition of the salt (AFS). A temperature that is higher than the temperature at which a reaction product is volatilized is higher than a temperature indicated by a vapor pressure curve of the reaction product. If the reaction product contains a plurality of compounds, a higher temperature is selected.

The temperature of the wafer is controlled by transferring the heat of the electrostatic chuck 12 cooled by circulating the coolant cooled to a predetermined temperature to the wafer via the heat transfer gas. Herein, the wafer is exposed to the plasma formed by the first high frequency power supply 42 for plasma formation and irradiated with the light from the plasma or the ions accelerated by the second high frequency power supply 44 for bias. As a result, the temperature of the wafer and particularly the temperature of the surface of the wafer facing the plasma may be higher than the controlled temperature. For this reason, if it is possible to measure an actual temperature of the wafer during the etching processing or estimate a temperature difference between the controlled temperature of the wafer and the actual temperature of the surface of the wafer from the process conditions, a set temperature for controlling the temperature of the wafer may be lowered in a range in which the temperature of the surface of the wafer is higher than the temperature indicated by the vapor pressure curve of the reaction product.

Further, in the etching method according to the exemplary embodiment, the wafer 27 is placed between the supporting table 11 of the placing table 8 and the gas shower head 31. Herein, the first high frequency power for forming plasma in the processing space 5 and the second high frequency (bias) power for accelerating the plasma are applied to the supporting table 11 of the placing table 8 and the gas shower head 31. According to this etching method, the etching hole of the high aspect ratio can be formed in the wafer by etching the wafer with the plasma, and, thus, the wafer 27 can be etched appropriately.

Furthermore, in the etching method according to the exemplary embodiment, the temperature of the surface of the wafer 27 is higher than the temperature indicated by the vapor pressure curve of the reaction production containing silicon and is included in the range of 100° C. or less. According to this etching method, for example, even if a device that can be damaged at a high temperature is provided on the wafer 27, the salt (AFS) adhering to the wafer 27 can be removed from the wafer 27, and, thus, the wafer 27 can be etched appropriately.

Moreover, in the above-described etching method according to the exemplary embodiment, the wafer 27 is etched when the temperature of the wafer 27 is equal to or lower than 100° C., but the wafer 27 may be etched when the temperature of the wafer 27 is equal to or higher than 100° C. Even in this case, according to this etching method, the salt (AFS) adhering to the wafer 27 can be removed from the wafer 27, and, thus, the wafer 27 can be etched appropriately.

Besides, in the above-described etching method according to the exemplary embodiment, a wafer containing silicon nitride (SiN) or a wafer including a multilayered film in which a plurality of silicon oxide films and a plurality of silicon nitride films are stacked is etched, but any etching target that does not contain silicon nitride (SiN) or does not include the multilayered film may be etched. Examples of the etching target may include an etching target containing silicon nitride (SiN) and silicon dioxide ($SiO_2$) or an etching target made of silicon carbonitride (SiCN) or silicon oxynitride (SiON). According to the etching method according to the exemplary embodiment, even if such an etching target is etched, the amount of the salt (AFS) adhering to the etching target can be reduced, and, thus, the etching target can be etched appropriately.

Further, in the above-described etching method according to the exemplary embodiment, chlorine gas ($Cl_2$) is added in the processing gas, but any compound containing chlorine (Cl) may be added. The compound containing chlorine (Cl) refers to a chlorine compound having a higher valence of chlorine group than chlorine gas ($Cl_2$). Examples of the chlorine compound may include silicon tetrachloride ($SiCl_4$). Examples of the chlorine compound may also include trichlorosilane ($SiHCl_3$), hexachlorodisilane ($Si_2Cl_6$), carbon tetrachloride ($CCl_4$), chloroform ($CHCl_3$), boron trichloride ($BCl_3$), phosphorus trichloride ($PCl_3$), phosphorus pentachloride ($PCl_5$), phosphoryl chloride ($POCl_3$) and nitrogen trichloride ($NCl_3$). Further, the compound containing chlorine (Cl) may be a chlorine compound having lower dissociation energy for dissociating a chlorine radical or chlorine ion than chlorine gas ($Cl_2$). Examples of the chlorine compound may include hydrogen chloride (HCl), dichlorosilane ($SiH_2Cl_2$), dichloromethane ($CH_2Cl_2$), chloromethane ($CH_3Cl$), chlorine trifluoride ($ClF_3$), disulfur dichloride ($S_2Cl_2$), thionyl chloride ($SOCl_2$), sulfuryl chloride ($SO_2Cl_2$), carbonyl dichloride ($COCl_2$), bromine monochloride (BrCl) and iodine monochloride (ICl).

Figure 16:
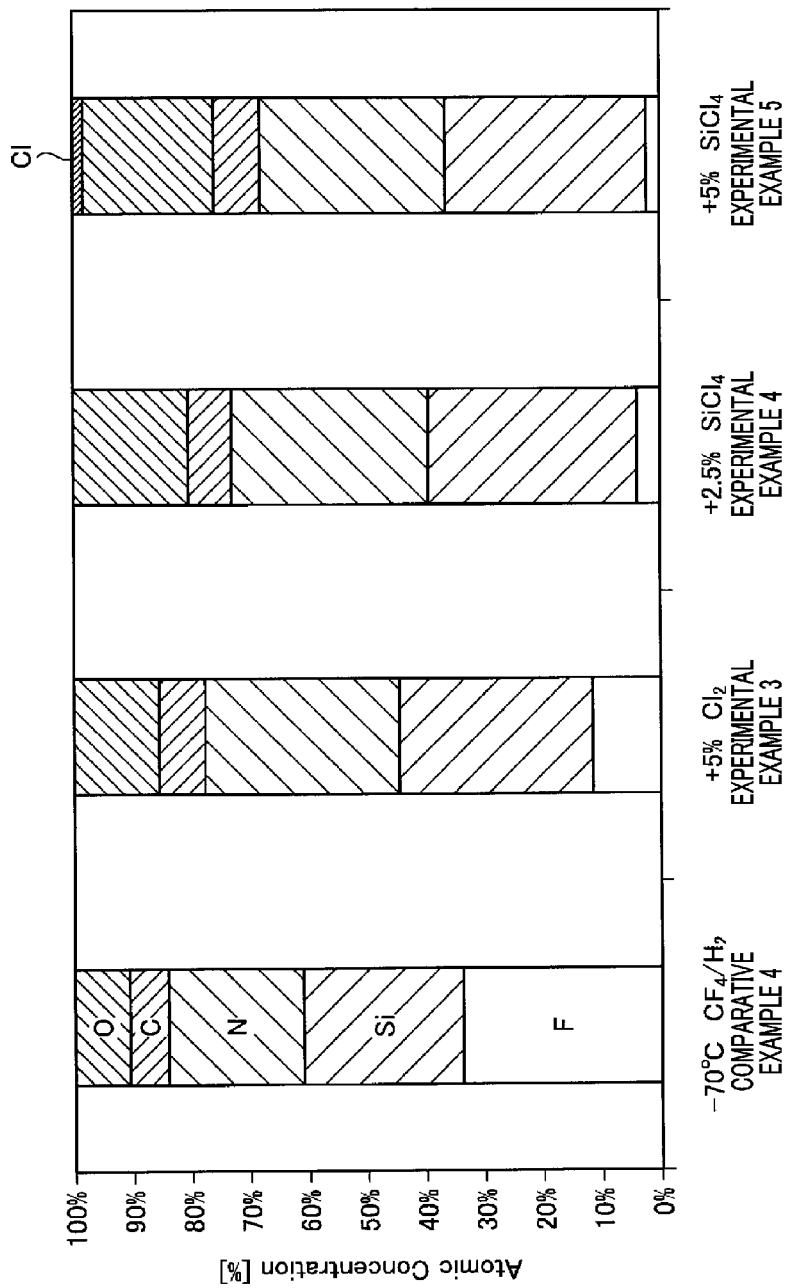
FIG. 16 is a graph showing an XPS analysis result of the surfaces of the wafers etched by the etching methods of the comparative example 4, the experimental example 3, an experimental example 4 and an experimental example 5, respectively.

FIG. 16 is a graph showing the XPS analysis result of the surfaces of the wafers etched by etching methods of the comparative example 4, the experimental example 3, an experimental example 4 and an experimental example 5, respectively. The wafer contains silicon nitride (SiN). Process conditions of the etching method of the experimental example 4 are the same as those of the etching method of the experimental example 3 except that the composition of the processing gas is substituted with $CF_4/H_2/2.5\%\ SiCl_4$. Process conditions of the etching method of the experimental example 5 are the same as those of the etching method of the experimental example 3 except that the composition of the processing gas is substituted with $CF_4/H_2/5\%\ SiCl_4$.

The graph in FIG. 16 shows that the amounts of fluorine (F) on the surfaces of the wafers etched by the etching methods of the experimental example 4 and the experimental example 5, respectively, are smaller than the amount of fluorine (F) on the surface of the wafer etched by the etching method of the comparative the experimental example 4. The graph in FIG. 16 shows that even when a processing gas in which another compound containing chlorine (Cl) is added is used, the etching method according to the exemplary embodiment can reduce the amount of the salt (AFS) adhering to the surface of the wafer 27. That is, the graph in FIG. 16 shows that even when a processing gas in which another compound containing chlorine (Cl) is added is used, the etching method according to the exemplary embodiment can appropriately etch the wafer 27.

Also, the graph in FIG. 16 shows that the amounts of fluorine (F) on the surfaces of the wafers etched by the etching methods of the experimental example 4 and the experimental example 5, respectively, are smaller than the amount of fluorine (F) on the surface of the wafer etched by the etching method of the experimental example 3. That is, the graph in FIG. 16 shows that when a processing gas in which silicon tetrachloride ($SiCl_4$) is added is used, the etching method according to the exemplary embodiment can appropriately etch the etching target, as compared with the case where a processing gas in which chlorine gas ($Cl_2$) is added is used.

Further, the graph in FIG. 16 shows that the amount of fluorine (F) on the surface of the wafer etched by the etching method of the experimental example 5 is smaller than the amount of fluorine (F) on the surface of the wafer etched by the etching method of the experimental example 4. That is, the graph in FIG. 16 shows that as the amount of silicon tetrachloride ($SiCl_4$) added to a processing gas increases, the etching method according to the exemplary embodiment can further reduce the amount of the salt (AFS) adhering to the surface of the etching target.

Figure 18:
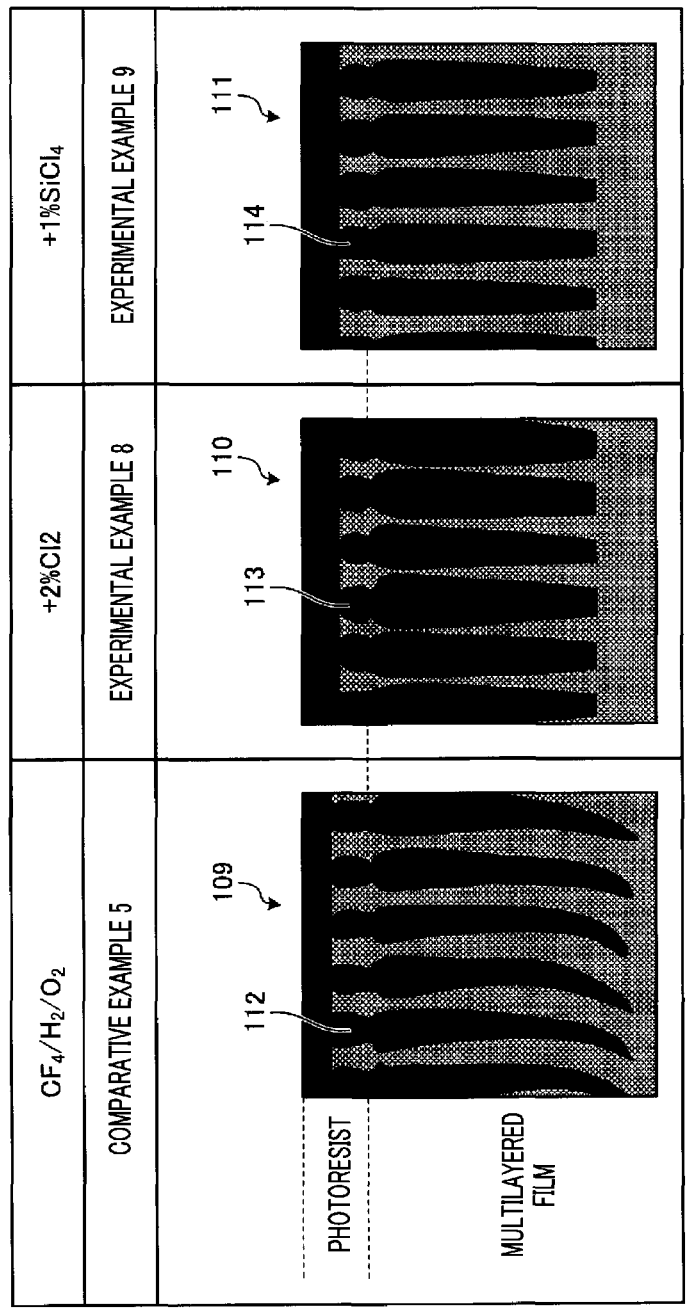
FIG. 18 is a graph showing a comparison result among wafers etched by the etching methods of a comparative example 5, an experimental example 8 and an experimental example 9, respectively.

FIG. 18 is a graph showing a comparison result of wafers 109 to 111 etched by etching methods of a comparative example 5, an experimental example 8 and an experimental example 9, respectively. The wafer 109 etched by the etching method of the comparative example 5 includes a silicon substrate, a multilayered film and a photoresist. The multilayered film is formed by alternately stacking a plurality of silicon oxide films and a plurality of silicon nitride films. The plurality of silicon oxide films is made of silicon dioxide ($SiO_2$). The plurality of silicon nitride films is made of silicon nitride (SiN). The multilayered film is formed on a one-side surface of the silicon substrate. The photoresist is provided openings in a predetermined pattern. The photoresist is formed on the multilayered film so that the multilayered film can be interposed between the silicon substrate and the photoresist. In the etching method of the comparative example 5, the wafer 109 is etched under the following process conditions.

Pressure within processing space 5: 20 mTorr
Frequency of first high frequency power: 40 MHz
Power of first high frequency power: 4.5 kW
Frequency of second high frequency power: 0.4 MHz
Power of second high frequency power: 5 kW
Composition of processing gas: $CF_4/H_2/O_2$
Temperature of wafer: −40° C.

The wafer 110 etched by the etching method of the experimental example 8 is formed in the same manner as the wafer 109. In the etching method of the experimental example 8, the wafer 110 is etched under the following process conditions. That is, in the etching method of the experimental example 8, chlorine gas ($Cl_2$) is added in the processing gas and the other conditions are the same as in the etching method of the comparative example 5.

Pressure within processing space 5: 20 mTorr
Frequency of first high frequency power: 40 MHz
Power of first high frequency power: 4.5 kW
Frequency of second high frequency power: 0.4 MHz
Power of second high frequency power: 5 kW Composition of processing gas: $CF_4/H_2/O_2/2\% Cl_2$
Temperature of wafer: $-40°$ C.

The wafer 111 etched by the etching method of the experimental example 9 is formed in the same manner as the wafer 109. In the etching method of the experimental example 9, the wafer 111 is etched under the following process conditions. That is, in the etching method of the experimental example 9, silicon tetrachloride ($SiCl_4$) is added in the processing gas and the other conditions are the same as in the etching method of the comparative example 5.

Pressure within processing space 5: 20 mTorr
Frequency of first high frequency power: 40 MHz
Power of first high frequency power: 4.5 kW
Frequency of second high frequency power: 0.4 MHz
Power of second high frequency power: 5 kW
Composition of processing gas: $CF_4/H_2/O_2/1\% SiCl_4$
Temperature of wafer: $-40°$ C.

FIG. 18 shows a cross section of the wafer 109, a cross section of the wafer 110 and a cross section of the wafer 111 in this order from the left. The comparison result in FIG. 18 shows that a bending degree of an etching hole 113 formed in the wafer 110 is suppressed more than a bending degree of an etching hole 112 formed in the wafer 109. Also, the comparison result in FIG. 18 shows that a bending degree of an etching hole 114 formed in the wafer 111 is suppressed more than the bending degree of the etching hole 112 formed in the wafer 109. That is, the comparison result in FIG. 18 shows that the etching method of the experimental example 8 and the etching method of the experimental example 9 can suppress the bending degree of the etching hole more than the etching method of the comparative example 5.

Further, the comparison result in FIG. 18 shows that the amount of silicon tetrachloride ($SiCl_4$) used in the etching method of the experimental example 9 is smaller than the amount of chlorine gas ($Cl_2$) used in the etching method of the experimental example 8. That is, the comparison result in FIG. 18 shows that the etching method of the experimental example 9 uses a smaller amount of the chlorine compound added in the processing gas than the etching method of the experimental example 8. Accordingly, the comparison result in FIG. 18 shows that when a processing gas in which silicon tetrachloride ($SiCl_4$) is added is used, a decrease in partial pressure of an etchant gas contained in the processing gas can be suppressed, as compared with the case where chlorine gas ($Cl_2$) is added in the processing gas.

Furthermore, in the above-described etching method according to the experimental examples, the compound containing chlorine (Cl) is added in the processing gas, but a molecular gas or a compound containing a halogen element other than chlorine (Cl) may be added. Examples of the halogen element may include bromine (Br) and iodine (I), examples of the molecular gas may include a bromine gas ($Br_2$) and an iodine gas ($I_2$), and examples of the compound may include hydrogen bromide (HBr) and hydrogen iodide (HI). Examples of the compound may also include trifluoroiodomethane ($CF_3I$), iodine heptafluoride ($IF_7$), iodine pentafluoride ($IF_5$), dichlorosilane ($SiH_2Cl_2$), trichlorosilane ($SiHCl_3$), hexachlorodisilane ($Si_2Cl_6$), carbon tetrachloride ($CCl_4$), chloroform ($CHCl_3$), dichloromethane ($CH_2Cl_2$), chloromethane ($CH_3Cl$), boron trichloride ($BCl_3$), phosphorus trichloride ($PCl_3$), phosphorus pentachloride ($PCl_5$), phosphoryl chloride ($POCl_3$), nitrogen trichloride ($NCl_3$), chlorine trifluoride ($ClF_3$), disulfur dichloride ($S_2Cl_2$), thionyl chloride ($SOCl_2$), sulfuryl chloride ($SO_2Cl_2$), carbonyl dichloride ($COCl_2$), bromine monochloride (BrCl), iodine monochloride (ICl), bromine pentafluoride ($BrF_5$) and bromine trifluoride ($BrF_3$).

The compound to be added in the processing gas is not limited thereto, and may be halogenated carbon ($CX_4$ or the like; X being any element (hereinafter, the same)), halogenated silane ($SiX_4$ or the like), halogenated boron ($BX_3$ or the like), halogenated sulfur ($S_2X_2$ or the like), halogenated phosphorus ($PX_3$ or the like), halogenated phosphoryl ($PDX_3$ or the like), halogenated thionyl ($SOX_2$ or the like), halogenated sulfuryl ($PO_2X_2$ or the like) and halogenated carbonyl ($COX_2$ or the like) containing at least one halogen element of chlorine (Cl), bromine (Br) or iodine (I). For example, the halogenated carbon containing at least one halogen element of chlorine (Cl), bromine (Br) and iodine (I) may be CHBrClF or $C_2HCl_2F_3$, and the halogenated silane containing at least one halogen element of chlorine (Cl), bromine (Br) or iodine (I) may be $SiClF_3$ or $SiH_3I$, $Si_3Cl_8$.

Figure 17:
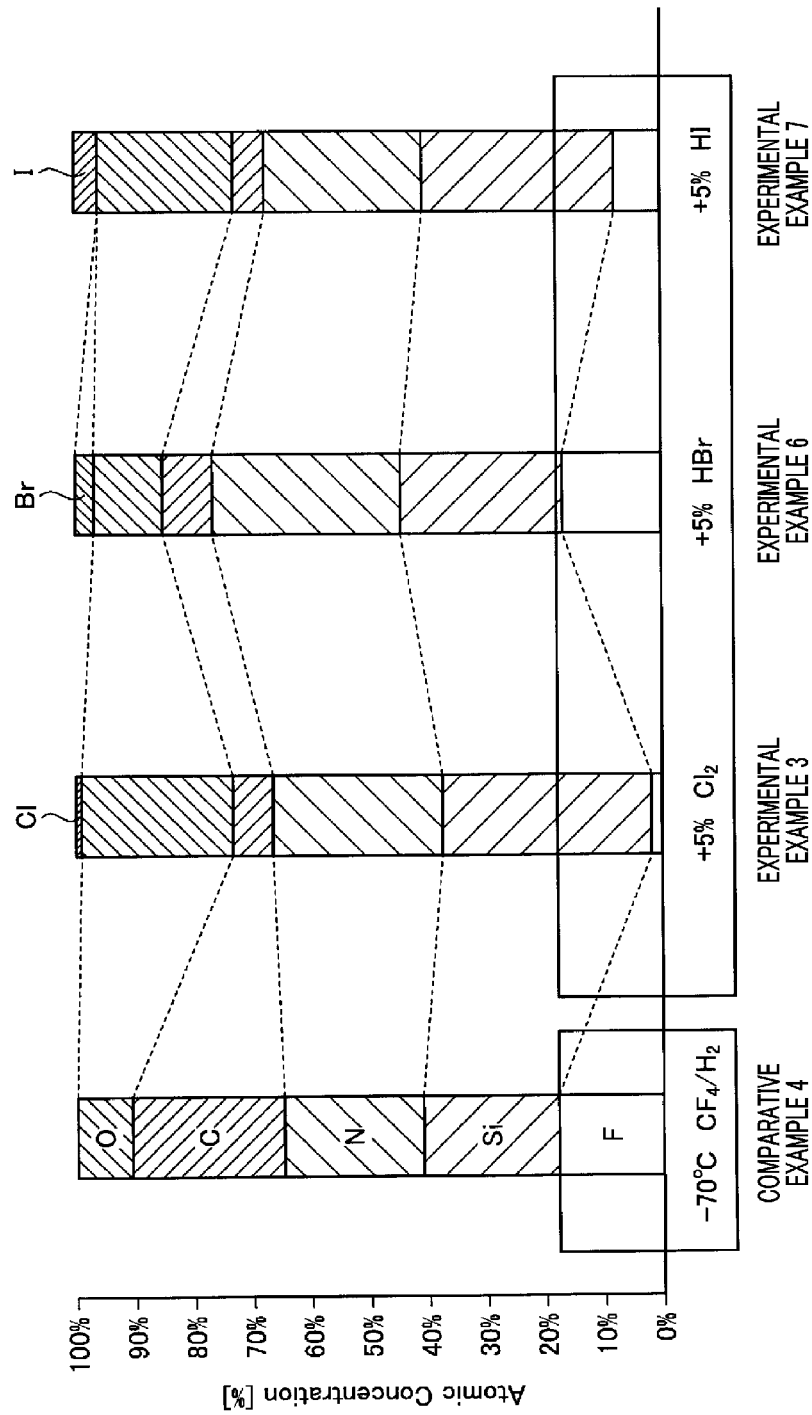
FIG. 17 is a graph showing an XPS analysis result of the surfaces of the wafers etched by the etching methods of the comparative example 4, the experimental example 3, an experimental example 6 and an experimental example 7, respectively.

FIG. 17 is a graph showing the XPS analysis result of the surfaces of wafers etched by the etching methods of the comparative example 4, the experimental example 3, an experimental example 6 and an experimental example 7, respectively. The wafer contains silicon nitride (SiN). Process conditions of the etching method of the experimental example 6 are the same as those of the etching method of the experimental example 3 except that the composition of the processing gas is substituted with $CF_4/H_2/HBr$. Process conditions of the etching method of the experimental example 7 are the same as those of the etching method of the experimental example 3 except that the composition of the processing gas is substituted with $CF_4/H_2/HI$.

The graph in FIG. 17 shows that the amounts of fluorine (F) on the surfaces of the wafers etched by the etching methods of the experimental example 6 and the experimental example 7, respectively, are smaller than the amount of fluorine (F) on the surface of the wafer etched by the etching method of the comparative example 4. The graph in FIG. 17 shows that even when a processing gas in which another compound containing bromine (Br) or iodine (I) is added is used, the etching method according to the exemplary embodiment can reduce the amount of the salt (AFS) adhering to the surface of the etching target. That is, the graph in FIG. 17 shows that even when the processing gas in which another compound containing bromine (Br) or iodine (I) is added is used, the etching method according to an exemplary embodiment can appropriately etch the wafer 27.

Also, in the above-described etching method, the etching target containing silicon (Si) and nitrogen (N), such as a silicon nitride film, is etched, but any etching target that does not contain nitrogen (N) but contains silicon (Si) may be etched. The etching target may be a silicon-containing film such as a silicon oxide film, silicon carbide, a silicon-containing low-dielectric constant film, single crystal silicon, polycrystalline silicon, amorphous silicon and the like. In this case, a compound containing nitrogen (N) is further mixed in the processing gas. Examples of the compound may include ammonia ($NH_3$) and nitrogen trifluoride ($NF_3$). Even in this case, the salt (AFS) is produced as the by-product of etching. For this reason, the etching method can reduce the amount of the by-product adhering to the surface of the etching target by decomposing the salt (AFS) and thus appropriately etch the etching target.

Further, in the above-described etching method, the wafer 27 is etched with capacitively-coupled plasma (CCP), but another plasma may be used. Examples of the plasma may include inductively coupled plasma (ICP) and plasma formed using a radial line slot antenna. Examples of the plasma may also include electron cyclotron resonance plasma (ECR) and helicon wave plasma (HWP).

Furthermore, in the above-described etching method, the plasma is used, but a liquid may be used. Even in this case, the etching method can reduce the amount of the salt (AFS) adhering to the surface of the etching target, and, thus, appropriately etch the etching target.

Moreover, in the above-described etching method according to the experimental examples, the compound containing the halogen element is added in the environment in which the etching target is etched, but a compound that does not contain the halogen element may be added. The compound contains an element that forms an anion (conjugate base) of an acid stronger than hydrogen fluoride (HF) or an element that forms a cation (conjugate acid) of a base stronger than ammonia ($NH_3$). Examples of the strong acid may include phosphoric acid ($H_3PO_4$), nitric acid ($HNO_3$), acetic acid (AcOH) and hydrogen sulfide ($H_2S$). Examples of the strong base may include cesium hydroxide (CsOH), potassium hydroxide (KOH), sodium hydroxide (NaOH), lithium hydroxide (LiOH), pyridine, aniline and hydrazine ($N_2H_4$). Even in this case, the etching method can reduce the amount of the salt (AFS) adhering to the surface of the etching target and thus can appropriately etch the etching target.

It should be understood that the exemplary embodiments disclosed herein are illustrative in all aspects and do not limit the present disclosure. The above-described exemplary embodiments may be omitted, substituted, or changed in various forms without departing from the scope and spirit of the appended claims.

EXPLANATION OF CODES

According to the exemplary embodiment, it is possible to appropriately etch the etching target.

We claim:
1. An etching method, comprising:
preparing a compound; and
etching an etching target in an environment in which the compound is present,
wherein the etching of the etching target includes:
etching the etching target in an environment in which hydrogen (H) and fluorine (F) are present when the etching target contains silicon nitride (SiN); and
etching the etching target in an environment in which nitrogen (N), hydrogen (H) and fluorine (F) are present when the etching target contains silicon (Si), and
wherein the compound contains an element that forms an anion of an acid stronger than hydrogen fluoride (HF) or contains an element that forms a cation of a base stronger than ammonia ($NH^3$),
wherein the acid includes at least one of phosphoric acid ($H_3PO_4$), nitric acid ($HNO_3$), acetic acid (AcOH) and hydrogen sulfide ($H_2S$), and
the base includes at least one of cesium hydroxide (CsOH), potassium hydroxide (KOH), sodium hydroxide (NaOH), lithium hydroxide (LiOH), pyridine, aniline and hydrazine ($N_2H_4$).
2. An etching method, comprising:
preparing a compound;
preparing a placing table on which an etching target is placed and a heat transfer gas source configured to supply a heat transfer gas between the etching target and the placing table;
setting a temperature of the etching target to be higher than a temperature at which a halogenated silicon is volatilized and in a range of 200° C. or less by transferring heat from the placing table to the etching target via the heat transfer gas; and
etching the etching target in an environment in which the compound is present,
wherein the etching of the etching target includes:
etching the etching target in an environment in which hydrogen (H) and fluorine (F) are present when the etching target contains silicon nitride (SiN); and
etching the etching target in an environment in which nitrogen (N), hydrogen (H) and fluorine (F) are present when the etching target contains silicon (Si), and
wherein the compound contains at least one halogen element selected from the group consisting of chlorine (Cl), bromine (Br) and iodine (I).
3. The etching method of claim 2,
wherein the etching target is etched in a processing space filled with a processing gas containing the compound.
4. The etching method of claim 3,
wherein the compound is at least one halogen compound selected from the group consisting of chlorine ($Cl_2$), silicon tetrachloride ($SiCl_4$), a bromine gas ($Br_2$) and an iodine gas ($I_2$), hydrogen chloride (HCl), hydrogen bromide (HBr), hydrogen iodide (HI), trifluoroiodomethane ($CF_3I$), iodine heptafluoride ($IF_7$), iodine pentafluoride ($IF_5$), dichlorosilane ($SiH_2Cl_2$), trichlorosilane ($SiHCl_3$), hexachlorodisilane ($Si_2Cl_6$), carbon tetrachloride ($CCl_4$), chloroform ($CHCl_3$), dichloromethane ($CH_2Cl_2$), chloromethane ($CH_3Cl$), boron trichloride ($BCl_3$), phosphorus trichloride ($PCl_3$), phosphorus pentachloride ($PCl_5$), phosphoryl chloride ($POCl_3$), nitrogen trichloride ($NCl_3$), chlorine trifluoride ($ClF_3$), disulfur dichloride ($S_2Cl_2$), thionyl chloride ($SOCl_2$), sulfuryl chloride ($SO_2Cl_2$), carbonyl dichloride ($COCl_2$), bromine monochloride (BrCl), iodine monochloride (ICl), bromine pentafluoride ($BrF_5$) and bromine trifluoride ($BrF_3$).
5. The etching method of claim 3,
wherein the compound is at least one halogen compound selected from the group consisting of halogenated carbon, halogenated silane, halogenated boron, halogenated sulfur, halogenated phosphorus, halogenated phosphoryl, halogenated thionyl, halogenated sulfuryl and halogenated carbonyl containing at least one of chlorine (Cl), bromine (Br) and iodine (I).
6. The etching method of claim 3,
wherein the etching target is placed between a pair of electrodes, and
a high frequency power configured to form plasma in the processing space and a high frequency power for bias configured to accelerate the plasma are applied to the pair of electrodes, and
the etching target is etched with the plasma.
7. The etching method of claim 3,
wherein a temperature of the etching target is higher than a temperature at which a reaction product containing silicon is volatilized and is included in a range of 100° C. or less .
8. The etching method of claim 7,
wherein the reaction product is halogenated silicon.
9. The etching method of claim 3, wherein the etching target contains silicon nitride (SiN) and silicon dioxide ($SiO_2$).

10. The etching method of claim 9,
wherein the etching target is formed by stacking a plurality of silicon nitride layers containing silicon nitride (SiN) and a plurality of silicon oxide layers containing silicon dioxide ($SiO_2$).

11. The etching method of claim 3,
wherein the compound contains chlorine (Cl) as the at least one halogen element.

12. The etching method of claim 11,
wherein the compound is chlorine ($Cl_2$).

13. The etching method of claim 11,
wherein the compound is a chlorine compound having a higher valence of chlorine group than chlorine ($Cl_2$).

14. The etching method of claim 13,
wherein the chlorine compound is at least one chlorine compound selected from the group consisting of silicon tetrachloride ($SiCl_4$), trichlorosilane ($SiHCl_3$), hexachlorodisilane ($Si_2Cl_6$), carbon tetrachloride ($CCl_4$), chloroform ($CHCl_3$), boron trichloride ($BCl_3$), phosphorus trichloride ($PCl_3$), phosphorus pentachloride ($PCl_5$), phosphoryl chloride ($POCl_3$) and nitrogen trichloride ($NCl_3$).

15. The etching method of claim 11,
wherein the compound is a chlorine compound having lower dissociation energy for dissociation of a chlorine radical or a chlorine ion than chlorine ($Cl_2$).

16. The etching method of claim 15,
wherein the chlorine compound is at least one chlorine compound selected from the group consisting of hydrogen chloride (HCl), dichlorosilane ($SiH_2Cl_2$), dichloromethane ($CH_2Cl_2$), chloromethane ($CH_3Cl$), chlorine trifluoride ($ClF_3$), disulfur dichloride ($S_2Cl_2$), thionyl chloride ($SOCl_2$), sulfuryl chloride ($SO_2Cl_2$), carbonyl dichloride ($COCl_2$), bromine monochloride (BrCl) and iodine monochloride (ICl).

17. An etching apparatus, comprising:
a chamber that forms a processing space in which an etching target is etched; and
a gas source configured to supply a processing gas containing a compound into the processing space;
a placing table on which the etching target is placed; and
a heat transfer gas source configured to supply a heat transfer gas between the etching target and the placing table,
wherein the compound contains an element that forms an anion of a stronger acid than hydrogen fluoride (HF) or contains an element that forms a cation of a stronger base than ammonia ($NH_3$), and
wherein the apparatus further comprises a control device configured to set a temperature of the etching target to be higher than a temperature at which a halogenated silicon is volatilized and in a range of 200° C. or less by transferring heat from the placing table to the etching target via the heat transfer gas.

18. The etching apparatus of claim 17,
wherein the stronger acid includes phosphoric acid ($H_3PO_4$), nitric acid ($HNO_3$), acetic acid (AcOH) and hydrogen sulfide ($H_2S$), and
the stronger base includes cesium hydroxide (CsOH), potassium hydroxide (KOH), sodium hydroxide (NaOH), lithium hydroxide (LiOH), pyridine, aniline and hydrazine ($N_2H_4$).

* * * * *

UNITED STATES PATENT AND TRADEMARK OFFICE
CERTIFICATE OF CORRECTION

| | | |
|---|---|---|
| PATENT NO. | : 11,270,889 B2 | Page 1 of 1 |
| APPLICATION NO. | : 16/646245 | |
| DATED | : March 8, 2022 | |
| INVENTOR(S) | : Maju Tomura et al. | |

It is certified that error appears in the above-identified patent and that said Letters Patent is hereby corrected as shown below:

In the Specification

Column 16, Line 10, "$PDX_3$" should be -- $POX_3$ --.

Signed and Sealed this
Eighth Day of November, 2022

*Katherine Kelly Vidal*

Katherine Kelly Vidal
*Director of the United States Patent and Trademark Office*